(12) United States Patent
Huang et al.

(10) Patent No.: US 8,772,900 B2
(45) Date of Patent: Jul. 8, 2014

(54) TRENCH SCHOTTKY BARRIER DIODE AND MANUFACTURING METHOD THEREOF

(75) Inventors: Tsung-Yi Huang, Hsinchu (TW); Chien-Hao Huang, Magong (TW)

(73) Assignee: Richteck Technology Corporation, Hsin-Chu (TW)

( * ) Notice: Subject to any disclaimer, the term of this patent is extended or adjusted under 35 U.S.C. 154(b) by 156 days.

(21) Appl. No.: 13/543,844

(22) Filed: Jul. 8, 2012

(65) Prior Publication Data

US 2013/0181319 A1 Jul. 18, 2013

(30) Foreign Application Priority Data

Jan. 17, 2012 (TW) .............................. 101101706 A

(51) Int. Cl.
*H01L 29/72* (2006.01)
(52) U.S. Cl.
USPC ............ 257/471; 257/E21.359; 257/E29.338; 438/570
(58) Field of Classification Search
CPC .................................................. H01L 27/0814
USPC ............ 257/471, E21.359, E29.338; 438/570
See application file for complete search history.

(56) References Cited

U.S. PATENT DOCUMENTS 8,299,494 B2 * 10/2012 Yilmaz et al. ................. 257/139

* cited by examiner

*Primary Examiner* — Edward Wojciechowicz
(74) *Attorney, Agent, or Firm* — Tung & Associates

(57) ABSTRACT

The present invention discloses a trench Schottky barrier diode (SBD) and a manufacturing method thereof. The trench SBD includes: an epitaxial layer, formed on a substrate; multiple mesas, defined by multiple trenches; a field plate, formed on the epitaxial layer and filled in the multiple trenches, wherein a Schottky contact is formed between the field plate and top surfaces of the mesas; a termination region, formed outside the multiple mesas and electrically connected to the field plate; a field isolation layer, formed on the upper surface and located outside the termination region; and at least one mitigation electrode, formed below the upper surface outside the termination region, and is electrically connected to the field plate through the field isolation layer, wherein the mitigation electrode and the termination region are separated by part of a dielectric layer and part of the epitaxial layer.

10 Claims, 7 Drawing Sheets

TRENCH SCHOTTKY BARRIER DIODE AND MANUFACTURING METHOD THEREOF

CROSS REFERENCE

The present invention claims priority to TW 101101706, filed on Jan. 17, 2012.

BACKGROUND OF THE INVENTION

1. Field of Invention

The present invention relates to a trench Schottky barrier diode (SBD) and a manufacturing method of an SBD; particularly, it relates to such SBD and manufacturing method wherein the breakdown voltage of the SBD is increased.

2. Description of Related Art

An SBD is a majority carrier device which has a high forward current and a very short recovery time because of a Schottky barrier generated by a Schottky contact which is formed between a metal layer and a semiconductor layer. However, a high leakage current is induced when a reverse bias is applied to the SBD, and therefore a trench SBD is invented. The trench SBD includes a semiconductor substrate with trenches, and a conductive material filled in the trenches, wherein the conductive material is separated from the semiconductor substrate by a dielectric layer therebetween. The trench SBD mitigates the high leakage current issue of the conventional SBD in a reverse bias operation by pinching off the reverse leakage current with a depletion region. However, when the trench SBD operates in a high voltage, a lower breakdown voltage of the trench SBD limits the application range of the trench SBD.

In view of the above, to overcome the drawback in the prior art, the present invention proposes a trench SBD and a manufacturing method thereof which provide a higher breakdown voltage so that the trench SBD may have a broader application range.

SUMMARY OF THE INVENTION

A first objective of the present invention is to provide a trench SBD.

A second objective of the present invention is to provide a manufacturing method of a trench SBD.

To achieve the objectives mentioned above, from one perspective, the present invention provides a trench SBD, which is formed on a first conductive type substrate. The trench SBD includes: a second conductive type epitaxial layer, which is formed on the substrate; a plurality of mesas, which are formed by etching the epitaxial layer from an upper surface of the epitaxial layer downward, wherein the etching of the epitaxial layer forms plural trenches; a dielectric layer, which is formed on side walls and bottoms of the plural trenches; a field plate, which is formed on the epitaxial layer and filled in the plural trenches, wherein the dielectric layer separates the field plate from the side walls and bottoms of the plural trenches, and a Schottky contact is formed between the field plate and top surfaces of the plural mesas; a termination region, which is formed outside an edge of the plural mesas and below the upper surface of the epitaxial layer, and is electrically connected to the field plate, wherein the dielectric layer separates the termination region from the epitaxial layer and the edge; a field isolation layer, which is formed on the upper surface of the epitaxial layer, and is located outside the termination region; and at least one mitigation electrode, which is formed below the upper surface of the epitaxial layer and outside the termination region, wherein the field plate is electrically connected to the at least one mitigation electrode through the field isolation layer, and wherein the mitigation electrode and the termination region are separated by part of the dielectric layer and part of the epitaxial layer.

In one preferable embodiment, the first conductive type is P-type and the second conductive type is N-type.

In the aforementioned embodiment, the field plate preferably includes: a polysilicon layer with P-type impurities doped, which is filled in the plural trenches; a Schottky barrier metal layer, which is formed on the upper surface of the epitaxial layer, and is electrically connected to the polysilicon layer, wherein a Schottky contact is formed between the Schottky barrier metal layer and the top surfaces of the plural mesas; and a metal layer, which is formed on the Schottky barrier metal layer, and electrically connected to the Schottky barrier metal layer.

In another preferable embodiment, the field plate includes: a Schottky barrier metal layer, which is formed on the top surfaces of the plural mesas and filled in the plural trenches, wherein a Schottky contact is formed between the Schottky barrier metal layer and the top surfaces of the plural mesas; and a metal layer, which is formed on the Schottky barrier metal layer, and is electrically connected to the Schottky barrier metal layer.

From another perspective, the present invention provides a manufacturing method of a trench SBD, including: providing a first conductive type substrate; forming a second conductive type epitaxial layer on the substrate; forming a plurality of mesas by etching the epitaxial layer from an upper surface of the epitaxial layer downward, wherein the etching of the epitaxial layer forms plural trenches; forming a dielectric layer on side walls and bottoms of the plural trenches; forming a termination region outside an edge of the plural mesas and below the upper surface of the epitaxial layer, wherein the dielectric layer separates the termination region from the epitaxial layer and the edge; forming at least one mitigation electrode below the upper surface of the epitaxial layer and outside the termination region, wherein the mitigation electrode and the termination region are separated by part of the dielectric layer and part of the epitaxial layer; forming a field isolation layer on the upper surface of the epitaxial layer outside the termination region; and forming a conductive field plate in the plural trenches and on the epitaxial layer, whereby a Schottky contact is formed between the field plate and top surfaces of the plural mesas, the field plate being electrically connected to the termination region and the field plate being electrically connected to the at least one mitigation electrode through the field isolation layer, wherein the dielectric layer separates the field plate from side walls and bottoms of the plural mesas.

In one preferable embodiment, the first conductive type is P-type and the second conductive type is N-type.

In the aforementioned embodiment, the step of forming the field plate preferably includes: filling a polysilicon layer doped with P-type impurities in the plural trenches; forming a Schottky barrier metal layer on the upper surface of the epitaxial layer, and electrically connecting the Schottky barrier metal to the polysilicon layer, wherein a Schottky contact is formed between the Schottky barrier metal layer and the top surfaces of the plural mesas; and forming a metal layer on and electrically connected to the Schottky barrier metal layer.

In the aforementioned embodiment, the step of forming the dielectric layer preferably includes: forming the dielectric layer on the upper surface of the epitaxial layer, the side walls and the bottoms of the plural mesas, and the top surfaces of the plural mesas; and removing part of the dielectric layer on the upper surface of the epitaxial layer and the top surfaces of the plural mesas.

In another preferable embodiment, the step of forming the field plate preferably includes: depositing a Schottky barrier metal layer in the plural trenches and on the top surfaces of the plural mesas, wherein a Schottky contact is formed between the Schottky barrier metal layer and the top surfaces of the plural mesas; and forming a metal layer on and electrically connected to the Schottky barrier metal layer.

In the aforementioned embodiment, the step of forming the dielectric layer preferably includes: forming the dielectric layer on the upper surface of the epitaxial layer, the side walls and the bottoms of the plural mesas, and the top surfaces of the plural mesas; and removing part of the dielectric layer on the upper surface of the epitaxial layer and the top surfaces of the plural mesas.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
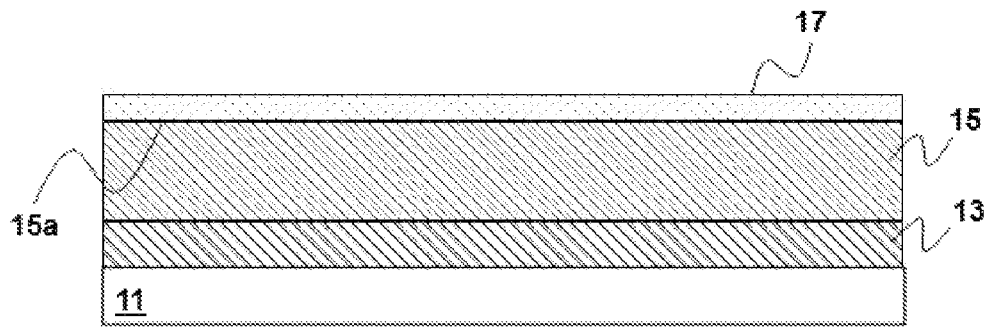
FIGS. 1A-1K show a first embodiment of the present invention.

FIGS. 1A-1K show a first embodiment of the present invention. As shown in FIG. 1A, epitaxial layers 13 and 15 are formed on a substrate 11. The substrate 11 is for example but not limited to a P-type semiconductor substrate. The epitaxial layers 13 and 15 are for example but not limited to N-type epitaxial layers with a low and a high impurity densities respectively. The epitaxial layers 13 and 15 may be replaced by one epitaxial layer with a single impurity density. Next, an oxide layer 17 is formed on an upper surface 15a of the epitaxial layer 15.

Figure 1B:
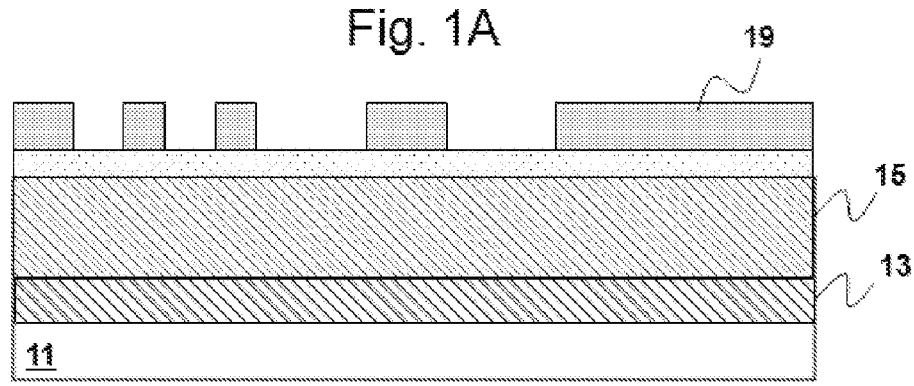
Figure 1C:
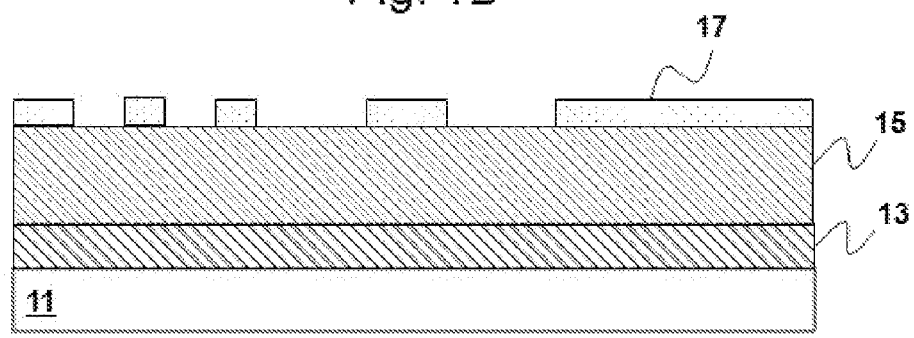
Figure 1D:
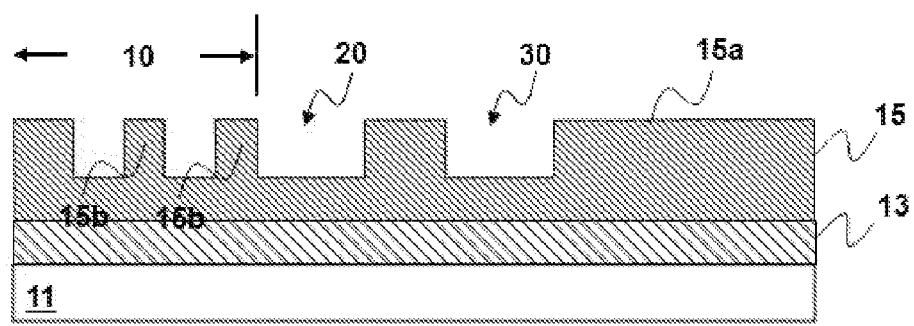

Next, as shown in FIG. 1B, a photoresist layer 19 is formed and patterned on the oxide layer 17 by a lithography process. As shown in FIG. 1C, part of the oxide layer 17 is removed by an etching process masked by the photoresist layer 19, such that the pattern is transferred from the photoresist layer 19 to the oxide layer 17. As shown in FIG. 1D, multiple trenches are formed by etching the epitaxial layer 15 from the upper surface 15a downward with the oxide layer 17 serving as a hard mask, such that multiple mesas 15b in the mesa region 10 are defined by the multiple trenches. In this embodiment, the lithography process and the etching process also define locations of a termination region 20 and a mitigation electrode 30.

Figure 1E:
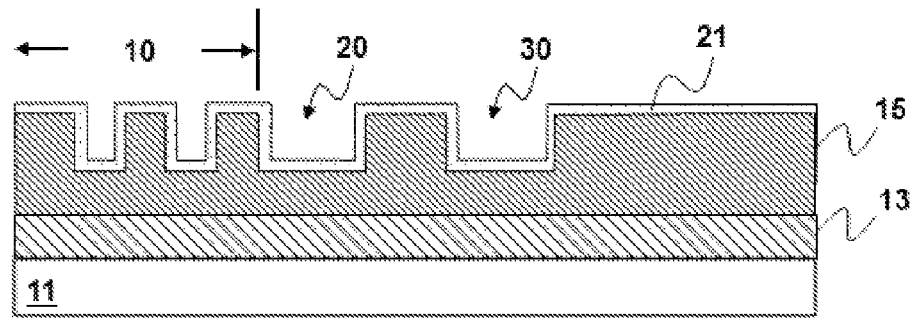
Figure 1F:
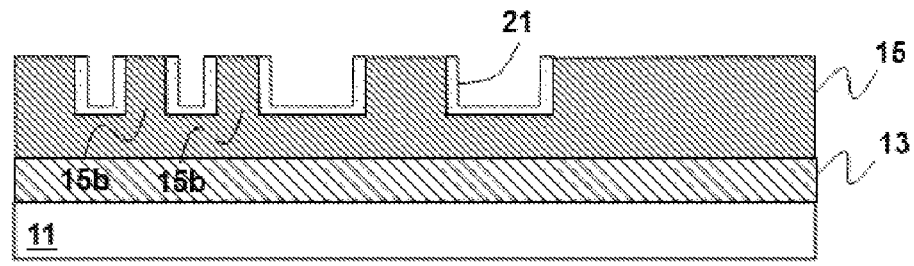
Figure 1G:
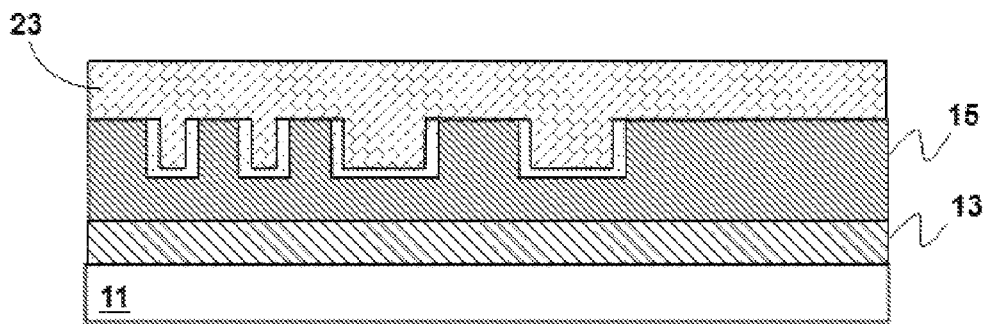
Figure 1H:
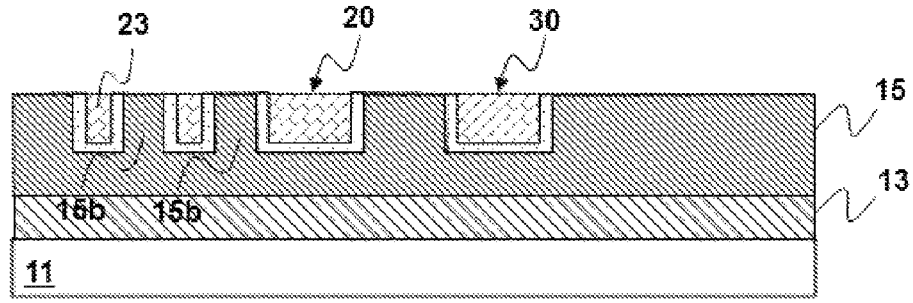

As shown in FIG. 1E, a dielectric layer 21 is formed on the epitaxial layer 15 by for example but not limited to a thermal oxidation process. Then, as shown in FIG. 1F, the dielectric layer 21 on the upper surface 15a is removed to expose the top surfaces of the mesas 15b, but the dielectric layer 21 on the side walls and bottoms of the mesas 15b remains. As shown in FIG. 1G, a polysilicon layer 23 doped with P-type impurities is deposited on the upper surface 15a of the epitaxial layer and filled in the multiple trenches. In the following, as shown in FIG. 1H, the polysilicon layer 23 on the upper surface 15a of the epitaxial layer 15 is removed, but the polysilicon layer 23 in the multiple trenches below the upper surface 15a of the epitaxial 15 remains.

Figure 1I:
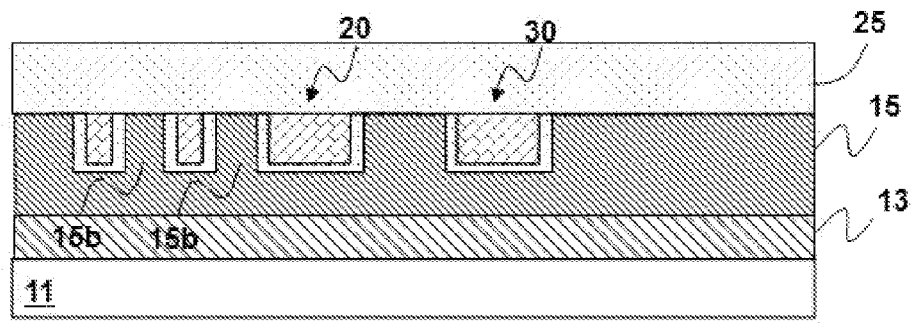

Thereafter, as shown in FIG. 1I, a field isolation layer 25 is formed on the upper surface 15a of the epitaxial layer 25. Next, part of the field isolation layer 25 is removed by a lithography process and an etching process, such that the remaining field isolation layer 25 is located outside the termination region 20, and the top surfaces of the mesas 15b, the termination region 20, and the mitigation electrode 30 are exposed as shown in FIG. 1J.

Figure 1J:
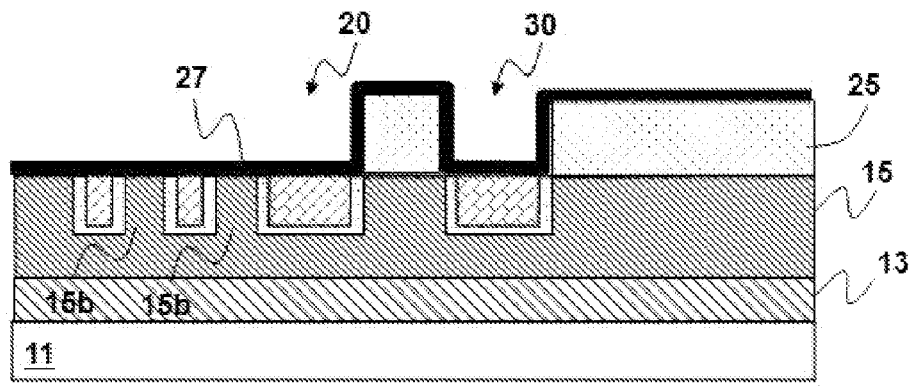
Figure 1K:
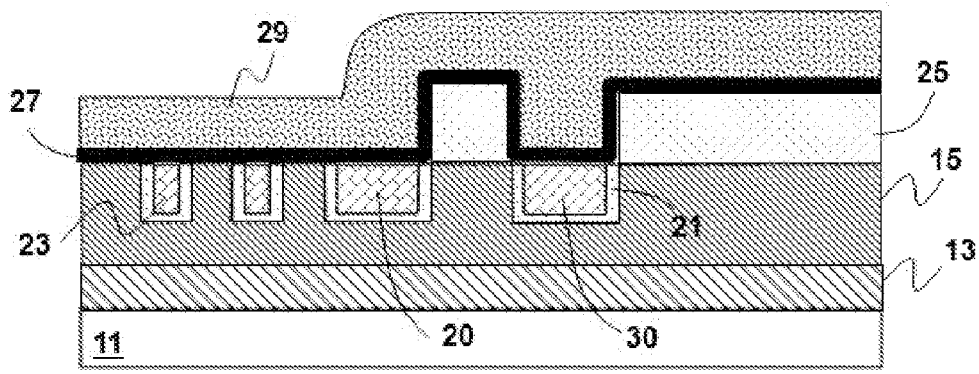

As shown in FIG. 1J, a Schottky barrier metal layer 27 is formed on the upper surface 15a of the epitaxial layer 15, which is electrically connected to the polysilicon layer 23, and thus a Schottky contact is formed between the Schottky barrier metal layer 27 and the top surfaces of the multiple mesas 15b. As shown in FIG. 1K, a metal layer 20 is formed on the Schottky barrier metal layer 27 and electrically connected to the Schottky barrier metal layer 27, the polysilicon layer 23 in the trenches, the termination region 20, and the mitigation electrode 30.

This embodiment is different from the prior art in that, a mitigation electrode 30 is formed outside the termination region 20, and the metal layer 29 and the mitigation electrode 30 are electrically connected with each other through one or more contact holes formed in the field isolation layer 25 outside the termination region 20. This arrangement has the following advantages: First, the trench SBD of the present invention has better characteristics because the present invention enhances the breakdown voltage of the trench SBD (more details will be described later). Second, in manufacturing process, no additional process step or mask is required, that is, the mitigation electrode 30 can be formed by the same lithography process, etching process, and deposition process for forming the other parts of the structure. As such, the trench SBD of the present invention has a better breakdown voltage while it can be manufactured by a low cost.

Figure 2A:
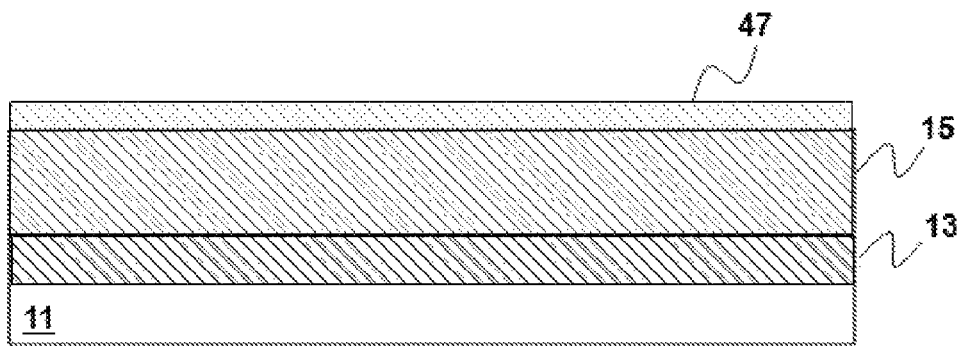
FIGS. 2A-2I show a second embodiment of the present invention.

FIGS. 2A-2I show a second embodiment of the present invention. As shown in FIG. 2A, epitaxial layers 13 and 15 are formed on a substrate 11. The substrate 11 is for example but not limited to a P-type semiconductor substrate. The epitaxial layers 13 and 15 are for example but not limited to N-type epitaxial layers with a low and a high impurity densities respectively. The epitaxial layers 13 and 15 may be replaced by one epitaxial layer with a single impurity density. Next, a nitride layer 47 is formed on an upper surface 15a of the epitaxial layer 15.

Figure 2B:
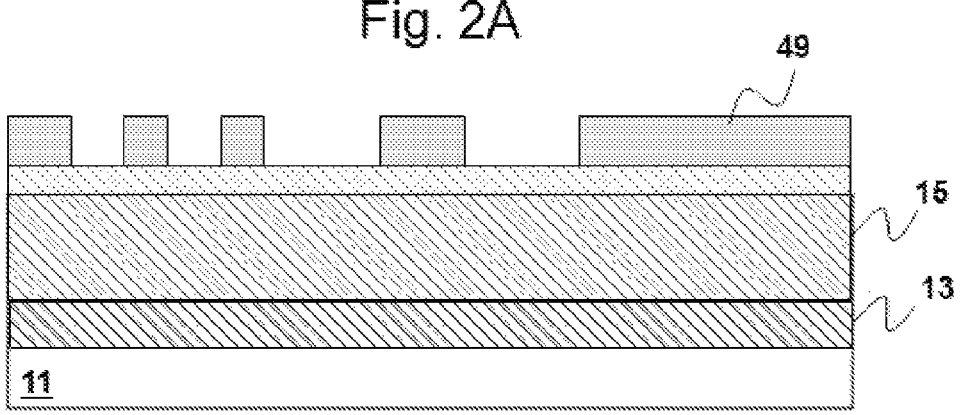
Figure 2C:
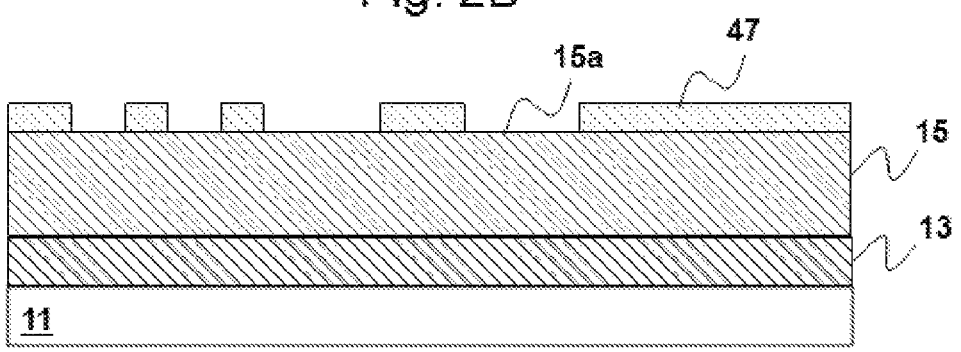
Figure 2D:
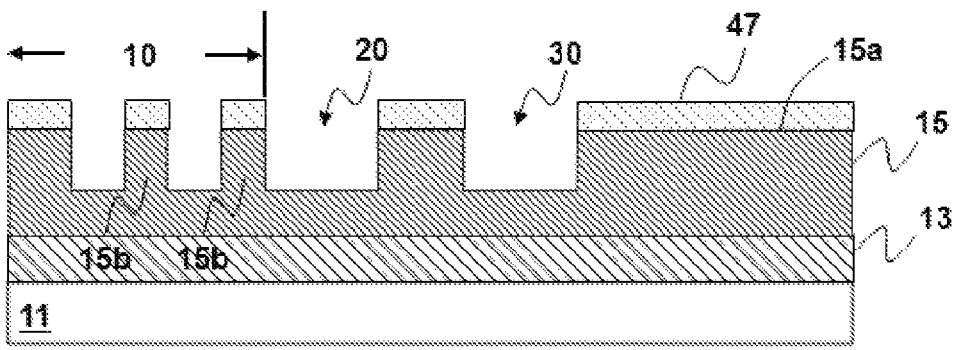

Next, as shown in FIG. 2B, a photoresist layer 49 is formed on the nitride layer 47 and patterned by a lithography process. As shown in FIG. 2C, part of the nitride layer 47 is removed by an etching process masked by the photoresist layer 49, such that the pattern is transferred from the photoresist layer 49 to the nitride layer 47. As shown in FIG. 2D, multiple trenches are formed by etching the epitaxial layer 15 from the upper surface 15a downward with the nitride layer 47 serving as a hard mask, such that multiple mesas 15b in the mesa region 10 are defined by the multiple trenches. In this embodiment, the lithography process and the etching process also define locations of a termination region 20 and a mitigation electrode 30.

Figure 2E:
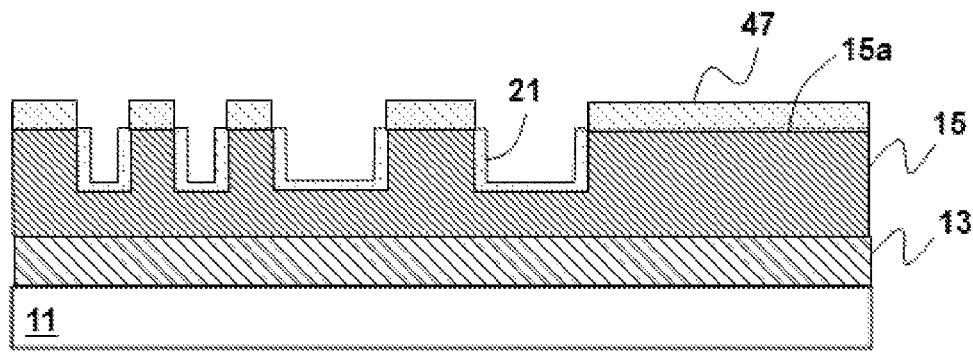
Figure 2F:
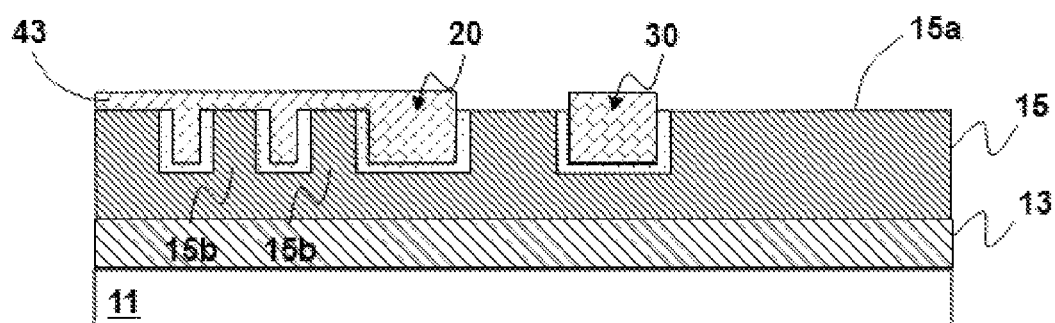

As shown in FIG. 2E, a dielectric layer 21 is formed on the epitaxial layer 15 by for example but not limited to a thermal oxidation process. The dielectric layer 21 is not formed on the upper surface 15a due to the nitride layer 47. Compared with the first embodiment, this embodiment saves several steps for removing the dielectric layer 21 on the upper surface 15a (such as: a deposition process step for protecting the side walls and bottoms of the dielectric layer 21, a lithography process step and an etching process step for removing the dielectric layer 21 on the upper surface 15a, and a process step for removing the protection materials, etc.) Then, as shown in FIG. 2F, the nitride layer 47 on the upper surface 15a is removed to expose the top surfaces of the mesas 15b, but the dielectric layer 21 on the side walls and bottoms of the mesas 15b remains. Next, a Schottky barrier metal layer 43 is formed on top surfaces of the multiple mesas 15b and in the trenches by for example but not limited to a physical sputter process, so that a Schottky contact is formed between the Schottky barrier metal layer 43 and the top surfaces of the multiple mesas 15b, and the termination region 20 and the mitigation 30 are also formed.

Figure 2G:
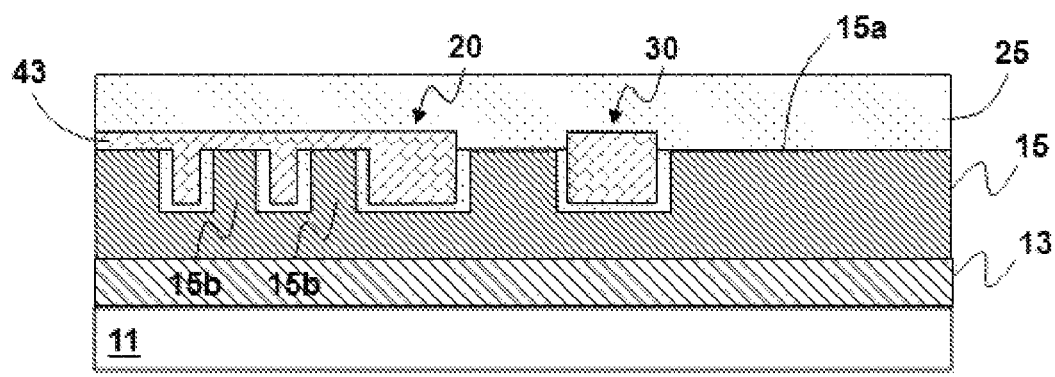
Figure 2H:
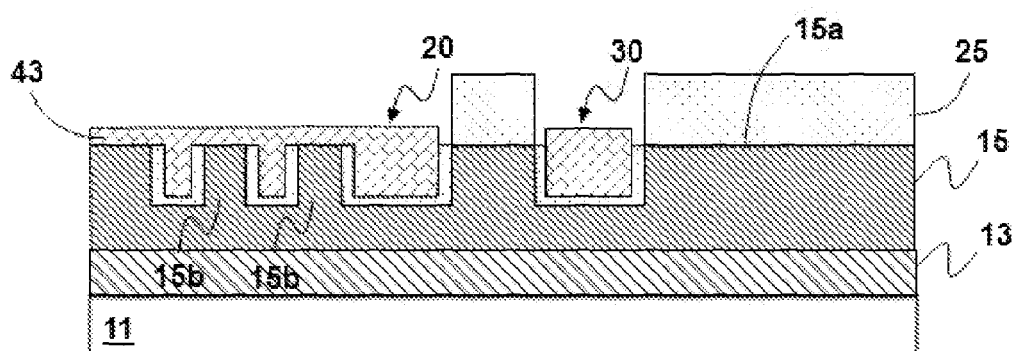

In the following, as shown in FIG. 2G, a field isolation layer 25 is formed on the upper surface 15a of the epitaxial layer 25. Next, part of the field isolation layer 25 is removed by a lithography process and an etching process, such that the remaining field isolation layer 25 is located outside the termination region 20, and the Schottky barrier metal layer 43 located on the top surfaces of the mesas 15b, the termination region 20, and the mitigation electrode 30 are exposed as shown in FIG. 2H.

Figure 2I:
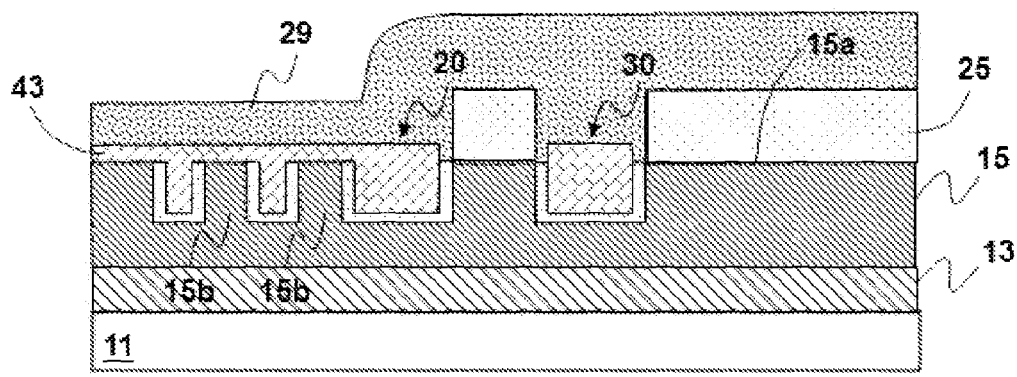

As shown in FIG. 2I, a metal layer 29 is formed on the Schottky barrier metal layer 43 and electrically connected to the Schottky barrier metal layer 43, the termination region 20, and the mitigation electrode 30.

Figure 3:
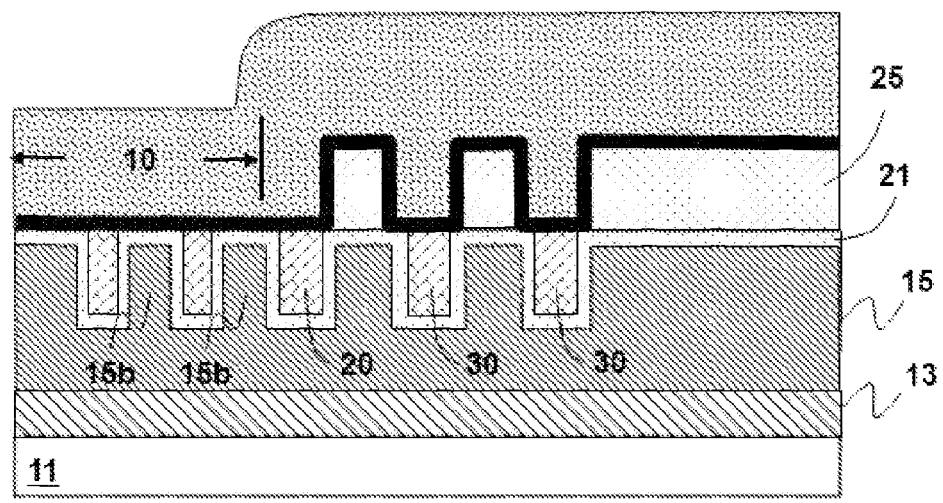
FIG. 3 shows a third embodiment of the present invention.

FIG. 3 shows a third embodiment of the present invention. This embodiment is different from the first embodiment in that it includes multiple mitigation electrodes 30. This embodiment shows that the number of the mitigation electrode 30 is not limited to one.

Figures 4A, 4B, 4C:
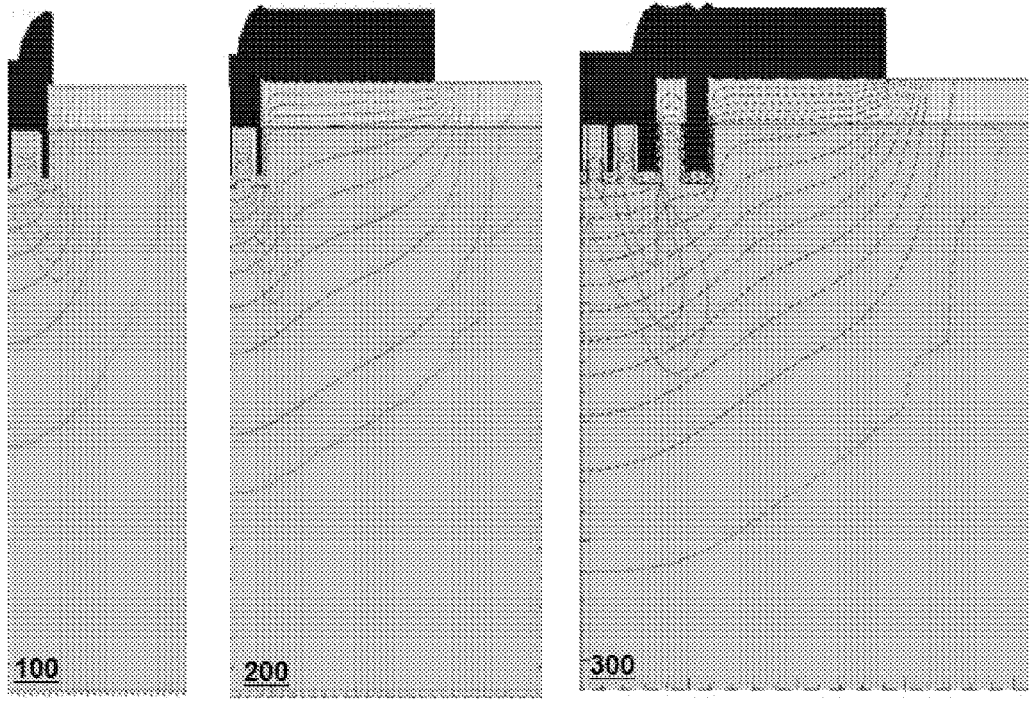
FIGS. 4A-4C show simulation potential contours of prior art trench SBDs and the trench SBD according to the present invention, respectively.

FIGS. 4A-4C show simulation potential contours of trench SBDs 100, 200, and 300 according to prior art and the present invention respectively, in the operation of reverse bias condition. When the trench SBDs 100 and 200 operate in the reverse bias condition, dense high potential points of are formed at the periphery of the trenches in the depletion region as shown by the potential contours, and thus the electrical field exceeds the limit which the physical structure of the protected device can sustain. Therefore, the breakdown voltages of the prior art trench SBDs are relatively low. The trench SBD 300 of the present invention decreases the electrical field because the mitigation electrode 30 mitigates the level differences at the periphery of the trenches of the trench SBD 300, and thus the breakdown voltage of the trench SBD of the present invention is improved.

Figure 5:
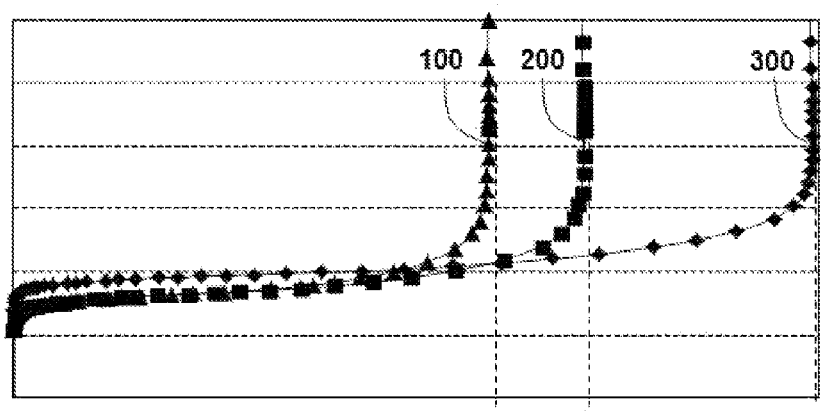
FIG. 5 is a characteristic chart showing breakdown voltages of the trench SBDs of FIGS. 4A-4C in reverse bias conditions.

FIG. 5 shows breakdown voltages of the trench SBDs 100, 200, and 300 shown in FIGS. 4A-4C in reverse biased conditions, which are about 80V, 90V, and 128V, respectively. Apparently, the trench SBD of the present invention has a better breakdown voltage.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography step described in the above can be replaced by electron beam lithography, X-ray lithography, etc. For yet another example, the hard mask which is formed on the epitaxial layer 15 is not limited to the oxide layer 17 or the nitride layer 47 as the embodiments describe, but it may be a layer combining the aforementioned layers or other hard masks, such as a carbide layer, etc. For another example, the substrate 11 is not limited to a P-type substrate; it may be an N-type substrate combined with other layers (such as epitaxial layers) having proper impurities concentrations. In view of the foregoing, the spirit of the present invention should cover all such and other modifications and variations, which should be interpreted to fall within the scope of the following claims and their equivalents.

What is claimed is:

1. A trench Schottky barrier diode (SBD) formed on a first conductive type substrate, comprising:
   a first conductive type substrate;
   a second conductive type epitaxial layer, which is formed on the substrate;
   a plurality of mesas, which are formed by etching the epitaxial layer from an upper surface of the epitaxial layer downward, wherein the etching of the epitaxial layer forms plural trenches;
   a dielectric layer, which is formed on side walls and bottoms of the plural trenches;
   a field plate, which is formed on the epitaxial layer and filled in the plural trenches, wherein the dielectric layer separates the field plate from the side walls and bottoms of the plural trenches, and a Schottky contact is formed between the field plate and top surfaces of the plural mesas;
   a termination region, which is formed outside an edge of the plural mesas and below the upper surface of the epitaxial layer, and is electrically connected to the field plate, wherein the dielectric layer separates the termination region from the epitaxial layer and the edge;
   a field isolation layer, which is formed on the upper surface of the epitaxial layer, and is located outside the termination region; and
   at least one mitigation electrode, which is formed below the upper surface of the epitaxial layer and outside the termination region, wherein the field plate is electrically connected to the at least one mitigation electrode through the field isolation layer, and wherein the mitigation electrode and the termination region are separated by part of the dielectric layer and part of the epitaxial layer.

2. The trench SBD of claim 1, wherein the first conductive type is P-type and the second conductive type is N-type.

3. The trench SBD of claim 2, wherein the field plate includes:
   a polysilicon layer doped with P-type impurities, which is filled in the plural trenches;
   a Schottky barrier metal layer, which is formed on the upper surface of the epitaxial layer, and is electrically connected to the polysilicon layer, wherein a Schottky contact is formed between the Schottky barrier metal layer and the top surfaces of the plural mesas; and
   a metal layer, which is formed on the Schottky barrier metal layer, and electrically connected to the Schottky barrier metal layer.

4. The trench SBD of claim 1, wherein the field plate includes:
   a Schottky barrier metal layer, which is formed on the top surfaces of the plural mesas and filled in the plural trenches, wherein a Schottky contact is formed between the Schottky barrier metal layer and the top surfaces of the plural mesas; and a metal layer, which is formed on the Schottky barrier metal layer, and is electrically connected to the Schottky barrier metal layer.

5. A manufacturing method of a trench Schottky barrier diode (SBD), comprising:

providing a first conductive type substrate;

forming a second conductive type epitaxial layer on the substrate;

forming a plurality of mesas by etching the epitaxial layer from an upper surface of the epitaxial layer downward, wherein the etching of the epitaxial layer forms plural trenches;

forming a dielectric layer on side walls and bottoms of the plural trenches;

forming a termination region outside an edge of the plural mesas and below the upper surface of the epitaxial layer, wherein the dielectric layer separates the termination region from the epitaxial layer and the edge;

forming at least one mitigation electrode below the upper surface of the epitaxial layer and outside the termination region, wherein the mitigation electrode and the termination region are separated by part of the dielectric layer and part of the epitaxial layer;

forming a field isolation layer on the upper surface of the epitaxial layer outside the termination region; and forming a conductive field plate in the plural trenches and on the epitaxial layer, whereby a Schottky contact is formed between the field plate and top surfaces of the plural mesas, the field plate being electrically connected to the termination region and the field plate being electrically connected to the at least one mitigation electrode through the field isolation layer, wherein the dielectric layer separates the field plate from side walls and bottoms of the plural mesas.

6. The manufacturing method of claim 5, wherein the first conductive type is P-type and the second conductive type is N-type.

7. The manufacturing method of claim 6, wherein the step of forming the field plate includes:

filling a polysilicon layer doped with P-type impurities in the plural trenches;

forming a Schottky barrier metal layer on the upper surface of the epitaxial layer, and electrically connecting the Schottky barrier metal to the polysilicon layer, wherein a Schottky contact is formed between the Schottky barrier metal layer and the top surfaces of the plural mesas; and forming a metal layer on and electrically connected to the Schottky barrier metal layer.

8. The manufacturing method of claim 5, wherein the step of forming the field plate includes:

depositing a Schottky barrier metal layer in the plural trenches and on the top surfaces of the plural mesas, wherein a Schottky contact is formed between the Schottky barrier metal layer and the top surfaces of the plural mesas; and forming a metal layer on and electrically connected to the Schottky barrier metal layer.

9. The manufacturing method of claim 7, wherein the step of forming the dielectric layer includes:

forming the dielectric layer on the upper surface of the epitaxial layer, the side walls and the bottoms of the plural mesas, and the top surfaces of the plural mesas; and removing part of the dielectric layer on the upper surface of the epitaxial layer and the top surfaces of the plural mesas.

10. The manufacturing method of claim 8, wherein the step of forming the dielectric layer includes:

forming the dielectric layer on the upper surface of the epitaxial layer, and the side walls, the bottoms, and the top surfaces of the plural mesas; and removing part of the dielectric layer on the upper surface of the epitaxial layer and the top surfaces of the plural mesas.

* * * * *